United States Patent [19]

Uchiyama et al.

[11] Patent Number: 4,885,622
[45] Date of Patent: Dec. 5, 1989

[54] PIN PHOTODIODE AND METHOD OF FABRICATION OF THE SAME

[75] Inventors: Akira Uchiyama; Yuuichi Masaki; Toshiyuki Iwabuchi; Tsutomu Nomoto; Masaaki Sakamoto, all of Tokyo, Japan

[73] Assignee: Oki Electric Industry Co., Ltd., Tokyo, Japan

[21] Appl. No.: 204,942

[22] Filed: Jun. 6, 1988

Related U.S. Application Data

[63] Continuation of Ser. No. 714,493, Mar. 21, 1985, abandoned.

[30] Foreign Application Priority Data

| Mar. 23, 1984 | [JP] | Japan | 59-55768 |
| Apr. 4, 1984 | [JP] | Japan | 59-87182 |
| May 2, 1984 | [JP] | Japan | 59-89072 |
| May 2, 1984 | [JP] | Japan | 59-89074 |
| Nov. 8, 1984 | [JP] | Japan | 59-234066 |

[51] Int. Cl.$^4$ .................................. H01L 27/14
[52] U.S. Cl. .................................. 357/30; 357/2; 357/58
[58] Field of Search ............... 357/2, 58, 30 D, 30 H, 357/30 K, 30 P, 30 Q

[56] References Cited

U.S. PATENT DOCUMENTS

| 3,982,267 | 9/1976 | Henry | 357/58 |
| 4,476,481 | 10/1984 | Iesaka et al. | 357/58 |
| 4,490,735 | 12/1984 | Schwaderer | 357/58 |

OTHER PUBLICATIONS

"Hydrogevated Amorphous Silicon PIN Diodes with High Rectification Ratlo", Seki et al., Journal of Non-Crystalline Solids 59 & 60 (1983) 1179–1182.

Primary Examiner—Edward J. Wojciechowicz
Attorney, Agent, or Firm—Wenderoth, Lind & Ponack

[57] ABSTRACT

A PIN photodiode is composed of a lower electrode deposited on a substrate, a photoelectric transducer of PIN construction deposited on the lower electrode, and an upper electrode deposited on the photoelectric transducer. A method of fabricating the PIN photodiode is also disclosed. All of electron-and-hole pairs generated in the photoelectric transducer in response to application of light are biased by the lower and upper electrodes. These electron-and-hole pairs are quickly picked up as a current between the electrodes for detecting the light falling on the PIN photodiode.

4 Claims, 5 Drawing Sheets

*Fig. 1*

PRIOR ART

PIN PHOTODIODE AND METHOD OF FABRICATION OF THE SAME

This application is a continuation of now abandoned application Ser. No. 714,493 filed Mar. 21, 1988.

BACKGROUND OF THE INVENTION

The present invention relates to a photodiode having a PIN construction, and more particularly to a PIN photodiode having a high speed of response to light and method of fabrication of the same.

One general PIN photodiode is described in "Hydrogenated amorphous silicon PIN diodes with high rectification ratio" by Kouich Seki, et al in Journal of Non-crystalline Solids, 59 & 60 (1983), pages 1179-1182, published by North-Holland Publishing Company. A general PIN photodiode will be described with reference to FIG. 1 of the accompanying drawings.

Figure 1:
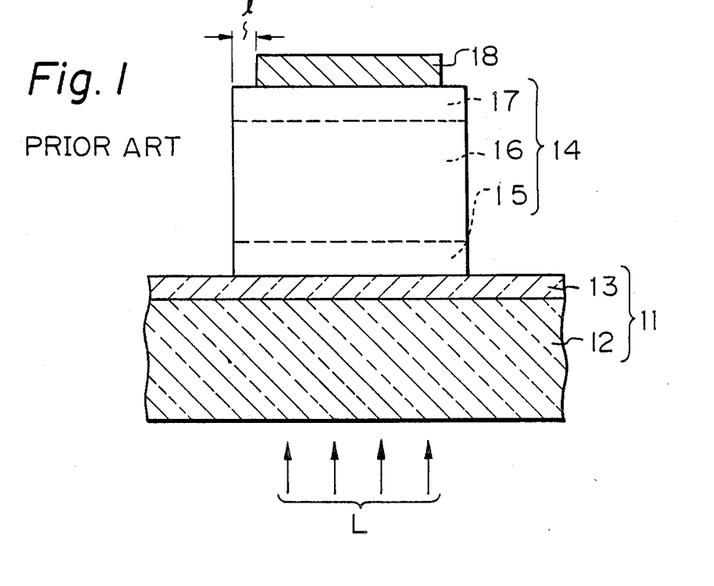
FIG. 1 is a cross-sectional view of a conventional PIN photodiode.

FIG. 1 shows in cross section of a general PIN photodiode. In FIG. 1, a transparent substrate 11 is composed of a transparent substrate portion 12 such as of glass and a transparent conductive layer 13 deposited on the transparent substrate portion 12 and serving as a lower electrode. A PIN diode 14 serving as a photoelectric transducer comprises successive photoconductive layers 15 through 17 such as of amorphous silicon (a - Si), the layer 15 being composed of a p-type a - Si layer, the layer 16 of an i-type (intrinsic) a - Si layer, and the layer 17 of an n-type a - Si layer. An upper electrode 18 is disposed on the n-type a - Si layer 17 of the photoconductive transducer 14. The upper electrode 18 has an electrode region lying inwardly of the regions of the lower photoconductive layers 15 through 17 in plan.

Operation of the prior PIN photodiode shown in FIG. 1 will be described below. When light L is illuminated through the transparent substrate 11 on the photoconductive transducer 14, electron-and-hole pairs are generated in the PIN diode 14 dependent on the intensity of the light L and picked up as a current between the upper electrode 18 and the lower electrode 13. The PIN diode 14 is reverse biased, and substantially no current will flow between the electrodes when no light is illuminated on the PIN diode 14. Therefore, the illumination of the light L can be detected by the current flowing between the electrodes 13, 18.

As illustrated in FIG. 1, the peripheral edges of the region of the upper electrode 18 are retracted a distance l inwardly from the peripheral edges of the photoconductive layers of the PIN diode 14. This is because if the electrode 18 and the photoconductive layers 15 through 17 were of the same size, a short circuit would occur between the lower electrode 13 and the upper electrode material which might be brought into contact with the electrode 13 due to a mask displacement when the upper electrode 18 is patterned after the photoconductive layers 15 through 17 have been patterned. Even if no mask displacement were caused, a leakage current between the electrodes 13, 18 would be increased through defects in the vicinity of the end faces of the photoconductive layers if the regions of the upper electrode 18 and photoconductive layers 15 through 17 were of the same size in plan, since the total thickness of the photoconductive layers 15 through 17 is about 1 μm at maximum. Such an increased leakage current would impair the characteristics of the PIN diode as an optical sensor device.

For the reasons described above, the peripheral edges of the PIN diode 14 is spaced the distance l from the peripheral edges of the electrode 18. Since a region of the PIN diode 14 within the distance l from the peripheral edges is not in contact with the upper electrode 18, such a non-contacting region is not subjected to the biasing voltage between the electrodes 13, 18. Thus, no biasing voltage is impressed on electrons and holes generated in the photoconductive layers within the distance l. It takes a long time for these electrons and holes to reach the electrodes 13, 18, and therefore the speed of response (response to light) of the current between the electrodes with respect to ON and OFF states of the incident light L is low.

SUMMARY OF THE INVENTION

It is an object of the present invention to increase the speed of response to light by absorbing all of the electrons and holes generated by application of light into upper and lower electrodes.

Another object of the present invention is to provide a PIN diode in which a surface protective film is deposited with good adhesion.

According to the present invention, a PIN photodiode comprises a substrate, a lower electrode conductive layer deposited on one surface of the substrate, a first conductivity-type layer of amorphous semiconductor deposited in a predetermined region on the lower electrode conductive layer, an intermediate layer of intrinsic amorphous semiconductor deposited on the first conductivity-type layer over an entire surface thereof, a second conductivity-type layer of amorphous semiconductor deposited on the intermediate layer partly over a surface thereof, an upper electrode conductive layer deposited on the second conductivity-type layer over an entire surface thereof, and an insulative protective film covering at least a portion of a surface of the upper electrode conductive layer.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

The embodiments of the present invention which will be described below are directed to PIN photodiodes of the type which is illuminated with light through substrates thereof.

Figure 2:
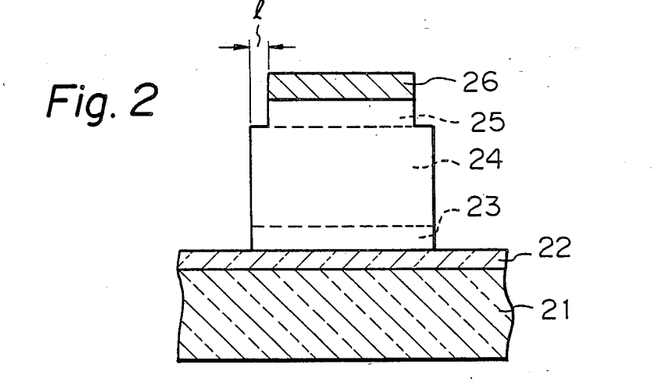
FIG. 2 is a cross-sectional view of a PIN photodiode according to a first embodiment of the present invention.

FIG. 2 shows in cross section a PIN photodiode according to a first embodiment of the present invention. The PIN photodiode of FIG. 2 includes a transparent substrate 21 on which is deposited a transparent electrode 22 serving as a lower electrode conductive layer made of a conductive material known as ITO that is a mixture of indium oxide and tin oxide. Over the transparent electrode 22, there are successively deposited a p-type a - Si layer 23 serving as a first conductive layer, an i-type a - Si layer 24 serving as an intermediate layer, and an n-type a - Si layer 25 serving as a second conductive layer. The n-type a - Si layer 25 is formed in a region smaller a width than the p-type a - Si layer 23 and the i-type a - Si layer 24. A metal electrode 26 which is identical in shape to the n-type a - Si layer 25 is formed on the n-type a - Si layer For fabricating the PIN photodiode of the above construction, the transparent substrate 21, the transparent electrode 22, the p-type a - Si layer 23, the i-type a - Si layer 24, the n-type a - Si layer 25, and the metal electrode 26 are first formed in the structure as shown in FIG. 1. Then, using the metal electrode 26 as a mask, an exposed region of the n-type a - Si layer 25 which is located outside of the metal electrode 26 is etched away as in a gas plasma etching processing employing a $CF_4$ gas or other appropriate gas. The lower i-type a - Si layer 24 may more or less be etched in this etching process because the speed of response to light is the speed of movement of electrons and holes in the p-type a - Si layer 23 or the n - type a - Si layer 25 and hence is dependent largely on whether the p-type a - Si layer 23 or the n-type a - Si layer 25 is in contact with the electrode or not, and the i-type a - Si layer 24 is not involved in the speed of response to light.

An experiment was conducted on the PIN photodiode of the first embodiment and the conventional PIN photodiode for speeds of response to light. The results of the experiment are given in the table I below. In the experiment, a light-emitting diode which emits light of a wavelength of 650 nm was used as a light source, and repetitive light pulses that are ON for 10 msec. and OFF for 10 msec. were employed. The inventive and comparative PIN photodiodes used were fabricated as follows: The p-type a - Si layer 15 or 23 was formed to a thickness of about 150 Å with a gas of $B_2H_6/SiH_4$ (800 ppm), the i-type a - Si layer 16 or 24 was formed to a thickness of about 1.5 $\mu$m with a gas of $B_2H_6/SiH_4$ (0.5 ppm), and the n-type a - Si layer 17 or 25 was formed to a thickness of about 1000 Å with a gas of $PH_3/SiH_4$ (2000 ppm). The metal electrode 18 or 26 was in the form of a circle having a diameter of 3 mm, with l=0.25 mm.

TABLE I

|  | Bias 0 V | Bias −3 V |
|---|---|---|
| Conventional example | 200 $\mu$sec | 120 $\mu$sec |
| 1st-embodiment example | 50 $\mu$sec | 6 $\mu$sec |

The table I shows that the time of response to light of the PIN photodiode of the first embodiment is ¼ of that of the conventional PIN photodiode at the biasing voltage of 0 V, and 1/20 of that of the conventional PIN photodiode at the biasing voltage of −3 V.

With the first embodiment, as described above, the region of the photosensitive element beneath the metal electrode, which region is out of contact with the metal electrode in plan and is not subjected to the biasing voltage, is removed. Therefore, all of the electrons and holes generated by application light flow effectively into the metal electrode and the transparent electrode under the applied biasing voltage to produce a current, so that the speed of response to light is much higher than that of the conventional PIN photodiode.

FIGS. 3(A) through 3(E) illustrate in cross section a process of fabricating a PIN photodiode array according to a second embodiment of the present invention. The PIN photodiode array of the second embodiment is composed of an array of individual PIN photodiodes according to the first embodiment. Since the PIN photodiode array of the second embodiment is structurally the same as the PIN photodiode of the first embodiment, the PIN photodiode array will be described principally with respect to the process of fabricating the same.

Figure 3A:
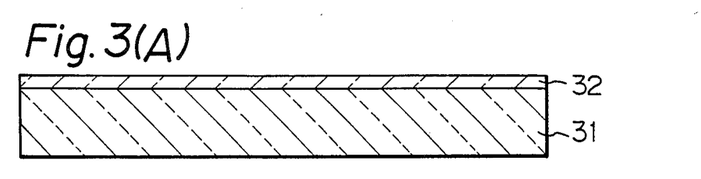
FIGS. 3(A) through 3(E) are cross-sectional views showing the progressive steps of fabrication of a PIN photodiode according to a second embodiment of the present invention.
Figure 3B:
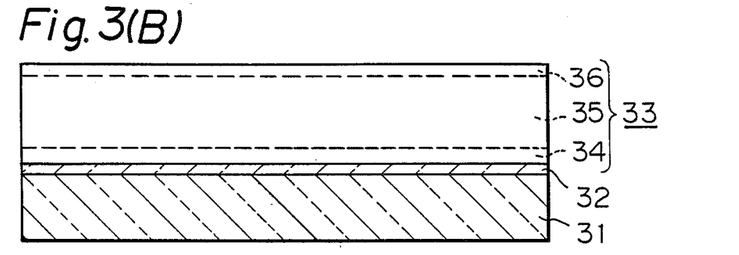

In FIG. 3(A), a transparent substrate 31 is made of glass, synthetic resin, or other appropriate materials. The transparent substrate 31 is covered with a transparent electrode 32 serving as a lower electrode conductive layer and made of a light-transmissive conductive material such as an indium-tin oxide. Where the transparent electrode 32 is made of an indium-tin oxide and a photosensitive element 33, described later, is made of a - Si, it is preferable to deposit the transparent electrode 32 as a thin layer. After the transparent electrode 32 has been deposited, the photosensitive element 33 is formed by depositing an a - Si layer (FIG. 3(B)). The a - Si layer may be formed at a low temperature ranging from 200 to 300 ° C. by decomposing a silane ($SiH_4$) gas with a high-frequency glow discharge. In the process of forming the a - Si layer, the silane gas is mixed with diborane ($B_2H_6$) in the range of from 500 to 10000 ppm to deposit a p-type layer 34 serving as a first conductivity-type layer to a thickness ranging from 100 to 2000 Å, then the silane gas is mixed with diborane in the range of from 0 to 100 ppm to deposit an i-type intermediate layer 35 to a thickness ranging from 0.5 to 1.5 $\mu$m on the p-type layer 34, and finally the silane gas is mixed with phosphine ranging from 500 to 10000 ppm to deposit an n-type layer 36 serving as a second conductivity-type layer to a thickness in the range of from 100 to 2000 Å on the intermediate layer 35. The photosensitive element 33 of a - Si is thus deposited as a combination of the first conductivity-type layer 34, the intermediate layer 35, and the second conductivity-type layer 36.

Figure 3C:
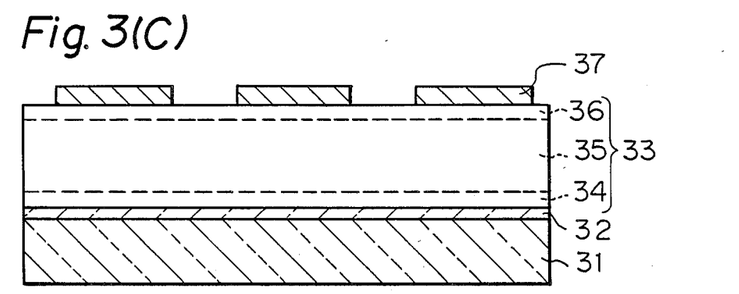
Figure 3D:
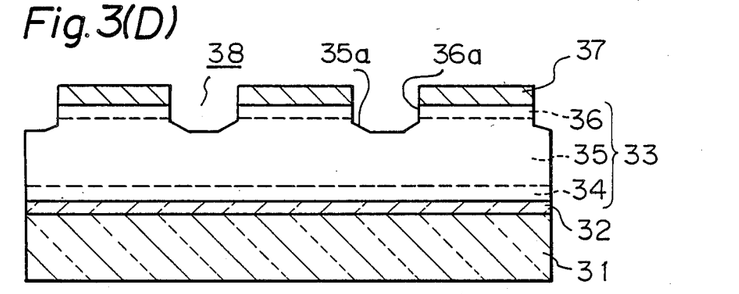

Then, a metal for a second electrode, such as chromium, Nichrome, molybdenum or aluminum, for example, is evaporated on the a - Si photosensitive layer 33, and a metal electrode 37 is formed from the evaporated metal layer by a photolithographic etching process (FIG. 3(C)).

Finally, with the metal electrode 37 used as a mask, the photosensitive element 33 is etched to form grooves 38 to separate the element 33 into photodiodes. The grooves 38 reach from the metal electrode 37 to a certain depth in the intermediate layer 35. Therefore, the intermediate layer 35 and the p-type layer 34 are shared by the separated photodiodes. The metal electrode 37 and the n-type layer 36 of each of the photodiodes separated by the grooves 38 are of the same dimensions, i.e., the contacting regions of the metal electrode 37 and the n-type layer 36 are identical in shape when viewed in plan or in a direction normal to the substrate. The n-type layer 36 has an end face 36a facing the groove 38 and lying substantially perpendicularly (ranging from 70 to 90 degrees) to the plane of transparent substrate 31. The side walls 35a of the intermediate layer 35 which are formed by the grooves 38 flare toward the transparent substrate 31 at an angle ranging from 30 to 70 degrees. The grooves 38 can be etched by a cylindrical plasma etching device, for example, in which a mixture of $CF_4$ and 3% to 15% of oxygen is used as an etching gas at a pressure in the range of from 0.1 to 1 Torr (FIG. 3(D)).

After the above etching process, a surface protective film 39 is deposited over the photosensitive element 33 and the metal electrode 37 to protect the edges thereof against damage, thus completing a photodiode array (FIG. 3(C)).

Figure 3E:
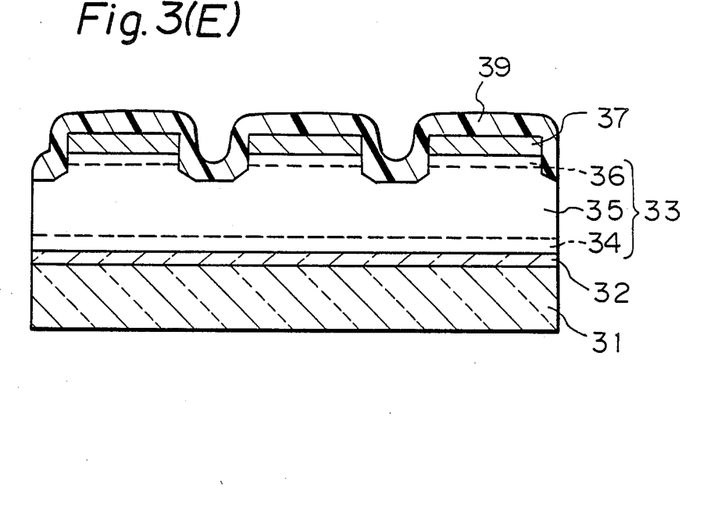

When light is illuminated on the photodiode array through the transparent substrate 31, the light falls on the photosensitive element 33 through the transparent substrate 31 and the transparent electrode 32 to generate carriers such as electron-and-hole pairs in the photosensitive element 33 dependent on the intensity of the illuminating light. When a biasing voltage is applied between the transparent electrode 32 and the metal electrode 37, the generated carriers can be picked up by a photocurrent.

An experiment was conducted on the PIN photodiode of the second embodiment and the conventional PIN photodiode for speeds of response to light under the same conditions as those described in the first embodiment, the biasing voltage being $-3$ V. The results of the experiment are given in the following table II:

TABLE II

| Conventional example | 120 μsec |
|---|---|
| 2nd-embodiment example | 6 μsec |

The table II shows the same experimental results as those of the PIN photodiode of the first embodiment.

With the PIN photodiode array according to the second embodiment, the metal electrode serving as the upper electrode conductive layer and the photosensitive element held in contact therewith are of the same shape, and the end faces of the second conductivity-type layer of the photosensitive element are inclined 70 to 90 degrees to the plane of the substrate. Electron-and-hole pairs generated by illumination of light are absorbed into the electrodes by the applied biasing voltage. Therefore, the PIN photodiode array of the second embodiment has a higher speed of response to light than hat of the prior art photodiode.

Furthermore, the side walls formed by the grooves defined by etching down to a certain depth in the intermediate layer of the photosensitive element are inclined 30 to 70 degrees with respect to the plane of the substrate. The inclined side walls allow the surface protective film to be deposited on the surfaces with good adhesion, and hence the photosensitive element and the electrode can be protected by the thin protective film. The PIN photodiode array of the second embodiment is therefore advantageous in that the time required to deposit the surface protective film is made much shorter than with the conventional photodiode.

Although the first conductivity-type layer and the intermediate layer are shared by the photodiodes, the second conductivity-type layers are separated respectively for the photodiodes, and no roundabout photocurrents flow from adjacent bits.

Figure 4:
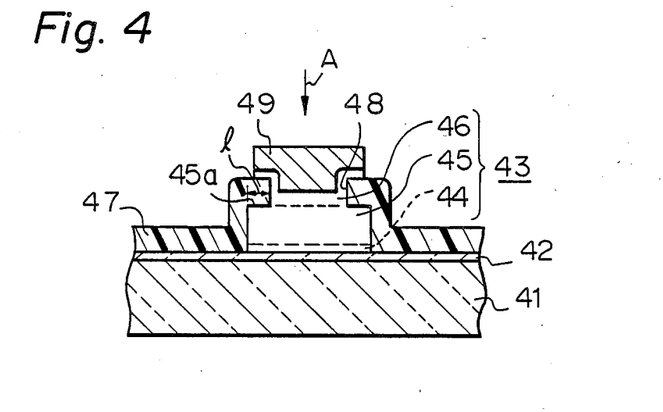
FIG. 4 is a cross-sectional view of a PIN photodiode according to a third embodiment of the present invention.

FIG. 4 cross-sectionally shows a PIN photodiode according to a third embodiment of the present invention. In the third embodiment, after layers up to an intermediate layer have been formed, they are covered with a protective film, a window is defined in the protective film, and a second conductivity-type layer is held in contact with the intermediate layer through the window. The construction of the third embodiment will be described with reference to FIG. 4. A transparent substrate 41 is made of quartz, glass, polyimide, or other appropriate materials, and covered with a transparent electrode 42 serving as a first electrode layer made as of titanium oxide or zinc oxide. The transparent electrode 42 may be made of a light-transmissive conductive material such as indium-tin oxide. A photosensitive element 43 may be formed of a - Si in the same process as in the conventional process. The photosensitive element 43 is of a PIN construction composed of a p-type a - Si layer 44 serving as a first conductivity-type layer, an i-type a - Si layer 45 serving as an intermediate layer, and an n-type a - Si layer 46 serving as a second conductivity-type layer.

In the third embodiment, the second conductivity-type layer 46 is deposited on the intermediate layer 45 through a window 48 defined in a protective film 47. This construction can be fabricated by depositing the protective film 47 on the first electrode layer 42, the end faces of the first conductivity-type layer 44 and the intermediate layer 45, before the second conductivity-type layer 46 is deposited, then defining the window 48 by way of etching in a central protective film region spaced the distance l from the peripheral edges of the intermediate layer 45, and then depositing the second conductivity-type layer 46 through the window 48. The second conductivity-type layer 46 is disposed on the intermediate layer 45 as exposed in the window 48, the side walls of the protective film 47 in the window 48, and peripheral edges of the protective film 47 around the window 48. However, the second conductivity-type layer 46 may be formed only within the window 48 in the protective film 47. The second conductivity-type layer 46 is not held in contact with the intermediate layer 45 in a region 45a thereof extending within the distance l from the peripheral edges of the intermediate layer 45. Therefore, the protective film 47 is formed over the non-contacting region 45a. The second conductivity-type layer 46 may be of an appropriate thickness.

In the third embodiment, a metal electrode 49 serving as a second electrode layer is deposited on the second conductivity-type layer 46. The metal electrode 49 is formed by evaporating a suitable metal such as chromium, Nichrome, molybdenum, aluminum, for example, and patterned by a photolithographic etching process. The metal electrode 49 and the second conductivity-type layer 46 may be patterned together or independently. In any case, the second electrode layer 49 and the second conductivity-type layer 46 should be identical in shape and size when viewed in plan in the direction of the arrow A, or the region of the second conductivity-type layer 46 should be smaller than the region of the second electrode layer 49. The second conductivity-type layer 46 is held in contact with the second electrode layer 49 in the region in which the second conductivity-type layer 46 contacts the intermediate layer 45.

When light is illuminated on the PIN photodiode through the transparent substrate 41, the light falls on the photosensitive element 43 through the transparent substrate 41 and the transparent electrode 42 to generate carriers such as electron-and-hole pairs in the photosensitive element 43 dependent on the intensity of the illuminating light. When a biasing voltage is applied between the transparent electrode 42 and the metal electrode 39, the generated carriers can be picked up by a photocurrent.

An experiment was conducted on the PIN photodiode of the second embodiment and the conventional PIN photodiode for speeds of response to light under the same conditions as those described in the first and second embodiments. The results of the experiment are given in the following table III:

TABLE III

|  | Bias 0 V | Bias −3 V |
| --- | --- | --- |
| Conventional example | 200 μsec | 120 μsec |
| 3rd-embodiment example | 50 μsec | 6 μsec |

With the PIN diode of the third embodiment, the second conductivity-type layer is retracted a certain distance inwardly from the side edges of the intermediate layer and held in contact therewith only in its central portion, and the second conductivity-type layer is held in contact with the metal electrode over its entire surface, the second conductivity-type layer and the metal electrode being in contact in the region smaller in plan than the size of the intermediate layer and the first conductivity-type layer. Therefore, electron-and-hole pairs generated by illumination of light are absorbed into the electrodes by the applied biasing voltage, and the PIN photodiode array of the third embodiment has a higher speed of response to light than that of the prior photodiode.

Since there is a dimensional difference between the metal electrode and the photosensitive element, the metal electrode is not in contact with the photosensitive element in the vicinity of end faces thereof. Thus, any leakage current flowing through defects in the end faces of the photosensitive element is much smaller than that in the conventional PIN photodiode. As the protective film is deposited on the intermediate layer, there is only a small step, and the protective film is deposited with good adhesion.

FIGS. 5(A) through 5(F) illustrate in cross section a process of fabricating a PIN photodiode array according to a fourth embodiment of the present invention. The PIN photodiode array of the fourth embodiment is composed of an array of individual PIN photodiodes according to the third embodiment. The PIN photodiode array of the fourth embodiment will be described principally with respect to the process of fabricating the same.

Figure 5A:
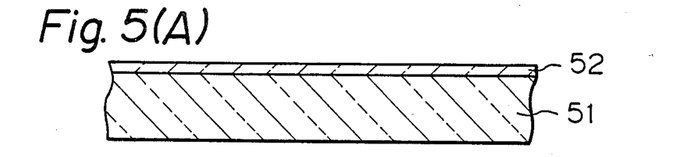
FIGS. 5(A) through 5(F) are cross-sectional views showing the progressive steps of fabrication of a PIN photodiode according to a fourth embodiment of the present invention.
Figure 5B:
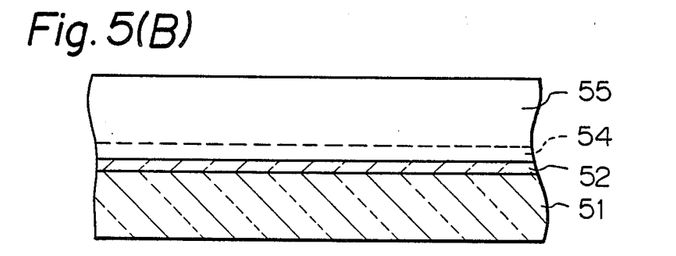
Figure 5C:
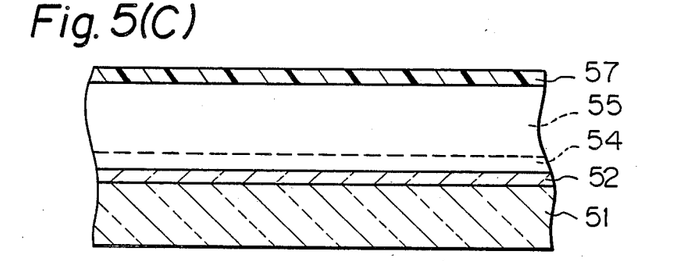

In FIG. 5(A), a transparent substrate 51 is made of glass, synthetic resin, or other appropriate materials. The transparent substrate 51 is covered with a transparent electrode 52 serving as a lower electrode conductive layer and made of a light-transmissive conductive material such as an indium-tin oxide. Where the transparent electrode 52 is made of an indium-tin oxide, it is preferable to mix about 5% of tin oxide with an indium oxide, and evaporate the mixture by an electron beam or sputtering in an oxygen atmosphere. In particular, where a photosensitive element 53, described later, is made of a - Si, a tin oxide should be evaporated on an indium-tin oxide to provide a double-layer film (FIG. 5(A)). Then, a first conductivity-type layer 54 and an intermediate layer 55 are deposited of a - Si on the transparent electrode 52. The a - Si layers may be formed at a low temperature ranging from 200 to 300° C. by decomposing a silane gas with a high-frequency glow discharge. In the process of forming the a - Si layers, the silane gas is mixed with diborane in the range of from 500 to 10000 ppm to deposit the p-type layer 54 serving as a first conductivity-type layer to a thickness ranging from 50 to 1000 Å, then the silane gas is mixed with diborane in of 100 ppm or below to deposit the i-type intermediate layer 55 to a thickness ranging from 0.5 to 1.5 μm on the p-type layer 54 (FIG. 5(B)).

Then, an insulative surface protecting film 57 is formed on the intermediate layer 55. Although the protective film 57 may be formed as a film of silicon oxide or alumina, for example, by sputtering, it is preferable to form the protective film 57 in this embodiment by a glow discharge process since the glow discharge process allows the protective film 57 to be formed continuously without exposure to air in the same glow discharge device. In this process, the film of silicon oxide (SiOx) may be formed of $SiH_4$ and nitrous oxide ($N_2O$), and the film of silicon nitride (SiNx) may be formed of $SiH_4$ and ammonium ($NH_3$) or $SiH_4$ and nitrogen ($N_2$)(FIG. 5(C)).

Figure 5D:
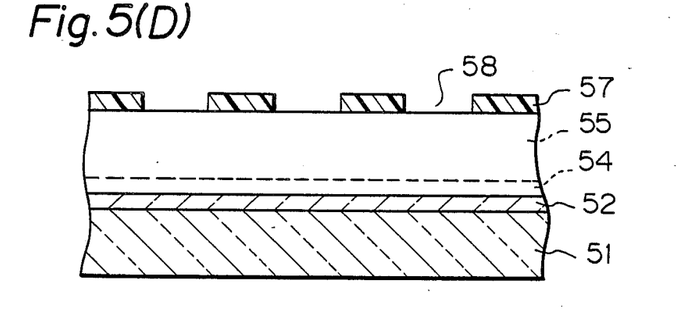
Figure 5E:
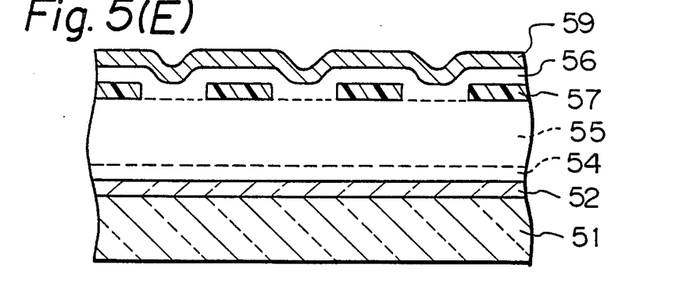
Figure 5F:
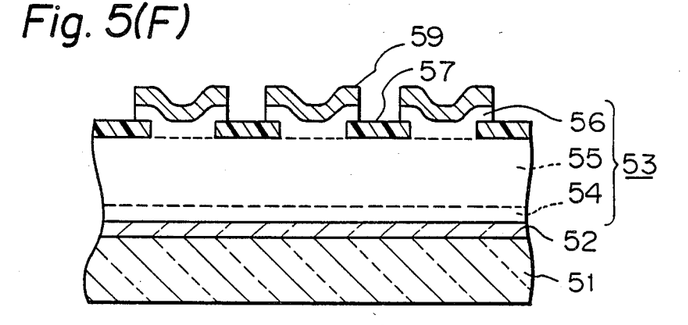

After the protective layer 57 has been formed, windows 58 are defined in the protective film 57 corresponding to photodetectors by an ordinary photolithographic etching process (FIG. 5(D)).

Thereafter, an n-type a - Si layer 56 serving as a second conductivity-type layer is deposited on the intermediate layer 55 to a thickness ranging from 100 to 2000 Å from a mixture of a silane gas and phosphine ($PH_3$) in the range of from 500 to 10000 ppm. Then, an electrode material such as aluminum, chromium, or Nichrome is evaporated and etched to form an upper electrode conductive layer or metal layer 59 (FIG. 5(E)).

Using the patterned metal electrode 59 as a mask, the lower second conductivity-type layer or n-type a - Si layer 56 is etched into the same shape as that of the metal electrode 59. In general, this etching is effected by a dry etching process which employs a gas of carbon tetrachloride ($CF_4$) with a few % of oxygen ($O_2$) added. Since in this process the speed at which the protective film 57 is etched is much lower than the speed at which the n-type a - Si layer 56 is etched, the protective film 57 is not removed, but only regions of the n-type a - Si layer 56 which are located other than beneath the second electrode 59 are removed. Therefore, there remains the second conductivity-type layer 56 which is of the same shape as that of the second electrode 59 as seen in the direction normal to the plane of the substrate (FIG. 5(F)).

Operation of the PIN photodiode of the fourth embodiment is the same as that of the PIN photodiode of the third embodiment, and hence will not be described. The results of a comparative experiment conducted on the PIN photodiode of the fourth embodiment and the conventional PIN photodiode under the same conditions as those of the second embodiment are shown in the following table IV:

TABLE IV

| Conventional example | 120 μsec |
| --- | --- |

TABLE IV-continued

| 4th-embodiment example | 6 μsec |
|---|---|

The table IV shows the same experimental results as those of the PIN photodiodes of the first through third embodiments.

With the PIN photodiode of the fourth embodiment, the second conductivity-type layer is composed of separate layer sections, is held in contact over its entire surface with the second electrode in the range in which the second conductivity-type layer contacts the intermediate layer. Therefore, a biasing voltage can be applied accurately, and a speed of response to light is increased.

Since the first conductivity-type layer and the intermediate layer are shared by the photodetectors, the surfaces of these layers are flat and allow the surface protective film to be deposited with good adhesion. As a consequence, the surface protective layer may be deposited at a reduced thickness and in a short period of time.

Since the second conductivity-type layer sections are separated, no roundabout bit current flows between adjacent photodetectors, and accurate photocurrents can be picked up from the respective photodetectors.

Figure 6:
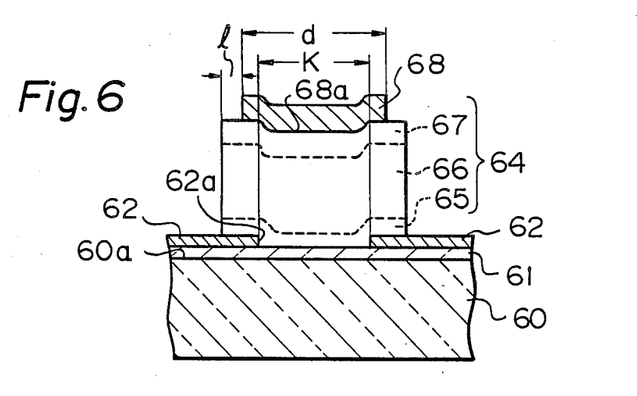
FIG. 6 is a cross-sectional view of a PIN photodiode according to a fifth embodiment of the present invention.

FIG. 6 shows in cross section of a PIN photodiode according to a fifth embodiment of the present invention. A substrate 60 and a lower electrode conductive layer 61 disposed on one surface of the substrate 60 are made of a transparent material for receiving illuminating light. A light shielding layer 62 is interposed between a photosensitive element 64 and the lower electrode conductive layer 61.

The substrate 60 may be formed of glass or quartz, while the conductive layer 61 may be in the form of a single layer formed of ITO or SnO$_2$ and two layers formed of ITO and SnO$_2$, respectively. Then, the light shielding layer 62 having an opening or a light detecting window 62a defined therein is formed on the conductive layer 61. The light shielding layer 62 may be formed of either a conductive material or an insulative material. For example, the light shielding layer 62 may be deposited as by evaporating, sputtering, plating Nichrome, chromium, molybdenum, stainless steel, or aluminum, for example, and then by forming the opening 62 in the evaporated layer by a photolithographic etching process or a lift-off process. The photosensitive element 64 is formed over the opening 62a and a surface surrounding the opening 62a. Where the photosensitive element 64 is formed of a PIN diode, a p-type a - Si layer 65, an i-type a - Si layer 66, and an n-type a - Si layer 67 are successively deposited, in the order from the conductive layer 61, by a glowdischarge decomposition process which employs a silane gas (SiH$_4$) as a main gas. Then, an upper electrode conductive layer 68 is formed on the photosensitive element 64.

When viewed in plane in a direction normal to the plane of the substrate 60, a region 68a in which the photosensitive element 64 and the upper electrode conductive layer 68 are in contact with each other is equal to or greater than the side of the light detecting window 62a, and the light detecting window 62a is positioned directly below the contact region 68a or lies within the size of the contact region 68a. For this purpose, the dimension k of the light detecting window 62a is equal to or smaller than the dimension d of the contact region 68a, and the light detecting window 62a is positioned within the size of the contact region 68a.

While the light shielding layer is placed on the lower electrode conductive layer, the light shielding layer may be placed on the surface of the substrate on which light falls, or may be interposed between the substrate and the lower electrode conductive layer.

An experiment was conducted on the PIN photodiode of the fifth embodiment and the conventional PIN photodiode for speeds of response to light under the same conditions as those described in the first embodiment, except that d=2.75 mm and k=2 mm. The results of the experiment are given in the following table V:

TABLE V

|  | Bias 0 V | Bias −3 V |
|---|---|---|
| Conventional example | 200 μsec | 120 μsec |
| 5th-embodiment example | 50 μsec | <10 μsec |

According to the fifth embodiment, light is prevented by the light shielding layer from entering a region indicated by 1 where the photosensitive element and the upper electrode are not in contact with each other, and electron-and-hole pairs which travel at a low speed are not generated in such a region. Since light enters through the light detecting window in the light shielding layer into a photosensitive element region indicated by k which is subjected to a high electric field, generating electron-and-hole pairs in that region, the speed of response to light is much higher than that of the conventional PIN photodiode.

In the first through fifth embodiments, the p-type a - Si layer and the n-type a - Si layer in the PIN construction may be switched around with respect to their conductivity types.

While in the first through fifth embodiments the PIN photodiode is of the type in which light falls on the substrate, the present invention may be of the type in which light falls on the upper electrode conductive layer. With such an alternative, the substrate and the lower electrode conductive layer are made of a material which is not light transmissive, and the upper electrode conductive layer is of a transparent material in the first through fourth embodiments. In the fifth embodiment, the substrate, the lower and upper electrode conductive layers are formed in the same manner as the first through fourth embodiments, and the light shielding layer is disposed over the PIN construction. The light shielding layer can be achieved by forming the protective film of a non-light-transmissive material.

Although certain preferred embodiments have been shown and described, it should be understood that many changes and modifications may be made therein without departing from the scope of the appended claims.

What is claimed is:

1. A PIN photodiode comprising;
    (a) a substrate formed of a radiation-transmissive material;
    (b) a lower electrode conductive layer of a radiation-transmissive material deposited on one surface of said substrate;
    (c) a first conductivity-type layer of amorphous semiconductor deposited on a portion of one surface of said lower electrode conductive layer opposite to a surface thereof facing said substrate;
    (d) an intermediate layer of intrinsic amorphous semiconductor deposited on all of one surface of said first conductivity-type layer opposite to a surface thereof facing said lower electrode conductive layer;
(e) a second conductivity-type layer of amorphous semiconductor deposited on a portion of one surface of said intermediate layer opposite to a surface thereof facing said first conductivity-type layer such that opposed lateral edges of said second conductivity-type layer are located inwardly of opposed lateral edges of said intermediate layer;
(f) an upper electrode conductive layer deposited on all of a surface of said second conductivity-type layer opposite to a surface thereof facing said intermediate layer, said second conductivity-type layer and said upper electrode conductive layer being separated into a plurality of sections by insulative regions which extend into said intermediate layer thereby dividing said second conductivity-type layer and said upper electrode conductive layer into said plurality of sections; and
(g) an insulative protective film covering at least a portion of a surface of said upper electrode conductive layer opposite to a surface thereof facing said second conductivity-type layer.

2. A PIN photodiode comprising;
(a) a substrate;
(b) a lower electrode conductive layer deposited on one surface of said substrate;
(c) a first conductivity-type layer of amorphous semiconductor deposited on a portion of one surface of said lower electrode conductive layer opposite to a surface thereof facing said substrate;
(d) an intermediate layer of intrinsic amorphous semiconductor deposited on all of one surface of said first conductivity-type layer opposite to a surface thereof facing said lower electrode conductive layer;
(e) a second conductivity-type amorphous semiconductor deposited on a portion of one surface of said intermediate layer a portion of one surface of said intermediate layer opposite to a surface thereof facing said first conductivity type layer such that opposed lateral edges of said second conductivity-type layer are located inwardly of opposed lateral edges of said intermediate layer;
(f) an upper electrode conductive layer of a radiation-transmissive material deposited on all of a surface of said second conductivity-type layer opposite to a surface thereof facing said intermediate layer, said second conductivity-type layer and said upper electrode conductive layer being separated into a plurality of sections by insulative regions which extend into said intermediate layer thereby dividing said second conductivity-type layer and said upper electrode conductive layer into said plurality of sections; and
(g) an insulative protective film covering at least a portion of a surface of said upper electrode conductive layer opposite to a surface thereof facing said second conductivity-type layer.

3. A PIN photodiode comprising:
(a) a substrate formed of a radiation-transmissive material;
(b) a lower electrode conductive layer of a radiation-transmissive material deposited on one surface of said substrate;
(c) a first conductivity-type layer of amorphous semiconductor deposited on a portion of one surface of said lower electrode conductive layer opposite to a surface thereof facing said substrate;
(d) an intermediate layer of intrinsic amorphous semiconductor deposited on all of one surface of said first conductivity-type layer opposite to a surface thereof facing said lower electrode conductive layer;
(e) a second conductivity-type layer of amorphous semiconductor deposited on a portion of one surface of said intermediate layer opposite to a surface thereof facing said first conductivity-type layer such that opposed lateral edges of said second conductivity-type layer are located inwardly of opposed lateral edges of said intermediate layer;
(f) an upper electrode conductive layer deposited on all of a surface of said second conductivity-type layer opposite to a surface thereof facing said intermediate layer, said second conductivity-type layer and said upper electrode conductive layer being separated into a plurality of sections by insulative regions which extend into said intermediate layer thereby dividing said second conductivity-type layer and said upper electrode conductive layer into said plurality of sections; and
(g) an insulative protective film covering an entire surface of said upper electrode conductive layer.

4. A PIN photodiode comprising;
(a) a substrate;
(b) a lower electrode conductive layer deposited on surface of said substrate;
(c) a first conductivity-type layer of amorphous semiconductor deposited on a portion of one surface of said lower electrode conductive layer opposite to a surface thereof facing said substrate;
(d) an intermediate layer of intrinsic amorphous semiconductor deposited on all of a surface of said first conductivity-type layer opposite to a surface thereof facing said lower electrode conductive layer;
(e) a second conductivity-type layer of amorphous semiconductor deposited on a portion of one surface of said intermediate layer opposite to the surface thereof facing said first conductivity-type layer such that opposed lateral edges of such second conductivity-type layer are located inwardly of opposed lateral edges of such intermediate
(f) an upper electrode conductive layer of a radiation-transmissive material deposited on all of a surface of said second conductivity-type layer, said second conductivity-type layer and said upper electrode conductive layer being separated into a plurality of sections by insulative regions which extend into said intermediate layer thereby dividing said second conductivity-type layer and said upper electrode conductive layer into said plurality of sections; and
(g) an insulative protective film covering an entire surface of said upper electrode conductive layer opposite to a surface thereof facing said second conductivity-type layer.

* * * * *